United States Patent [19]

Olsen

[11] 4,416,011

[45] Nov. 15, 1983

[54] SEMICONDUCTOR LIGHT EMITTING DEVICE

[75] Inventor: Gregory H. Olsen, East Windsor, N.J.

[73] Assignee: RCA Corporation, New York, N.Y.

[21] Appl. No.: 280,476

[22] Filed: Jul. 6, 1981

[51] Int. Cl.³ .............................................. H01S 3/19
[52] U.S. Cl. ...................................... 372/45; 357/17; 372/46
[58] Field of Search ................ 372/44, 45, 46; 357/17

[56] References Cited

U.S. PATENT DOCUMENTS

| Re. 29,866 | 12/1978 | Yonezu | 331/94.5 |
|---|---|---|---|
| 3,701,047 | 10/1972 | Caplan et al. | 331/94.5 |
| 3,753,801 | 8/1973 | Lockwood et al. | 148/171 |
| 3,978,428 | 8/1976 | Burnham et al. | 331/94.5 |
| 4,092,659 | 5/1978 | Ettenberg | 357/18 |
| 4,116,733 | 9/1978 | Olsen et al. | 148/175 |
| 4,124,826 | 11/1978 | Dixon et al. | 331/94.5 |
| 4,178,564 | 12/1979 | Ladany et al. | 331/94.5 |
| 4,213,808 | 7/1980 | Thompson et al. | 148/188 |
| 4,215,319 | 7/1980 | Botez | 331/94.5 |
| 4,249,142 | 2/1981 | Burnham et al. | 331/94.5 |
| 4,321,556 | 3/1982 | Sakuma | 372/45 |

FOREIGN PATENT DOCUMENTS 55-105392  8/1980  Japan ................................. 372/45

OTHER PUBLICATIONS

InGaAsP Quaternary Alloys: Composition, Refractive Index and Lattice Mismatch, G. H. Olsen et al., Journal of Electronic Materials, vol. 9, No. 6, 1980, pp. 977–987.

Primary Examiner—James W. Davie
Attorney, Agent, or Firm—Birgit E. Morris; Donald S. Cohen; William J. Burke

[57] ABSTRACT

A light emitting device comprising a first confinement layer, an active layer having a vee-shaped groove therein extending from a surface thereof towards the first confinement layer and a second confinement layer filling the groove and overlying the surface of the active layer. Electrical current flowing in the device flows through the grooved portion of the active region thereby providing confinement of the current and the light beam emitted by the device in the plane of the active layer.

7 Claims, 2 Drawing Figures

SEMICONDUCTOR LIGHT EMITTING DEVICE

The government has rights in this invention pursuant to Contract No. DAAK70-80-C-0070 awarded by the Department of the Army.

The invention relates to a semiconductor light emitting device having a vee-shaped groove in the active layer to provide control of the output light beam.

BACKGROUND OF THE INVENTION

A semiconductor light emitting device includes a body of semiconductor material, generally composed of group III-IV compounds, having a thin active layer with a layer of p-type conductivity material on one side of the active layer and a layer of n-type conductivity material on the other side of the active layer. Such a laser typically emits light in more than one optical mode which limits its utility. Botez, in U.S. Pat. No. 4,215,319 issued July 29, 1980, and entitled SINGLE FILAMENT SEMICONDUCTOR LASER and assigned to the assignee of the present application, has disclosed a semiconductor laser having a stable, single mode output light beam. The control over the output light beam in this laser arises from the tapering in thickness of the layers prepared by deposition of the confinement and active layers onto a substrate having a pair of substantially parallel grooves therein. The tapering is caused by the difference in growth rate of the layers over a land between the grooves and over the grooves when the layers are prepared by liquid or vapor phase epitaxy.

However, if the layers are deposited on an InP substrate having such a pair of parallel grooves using either liquid or vapor phase epitaxy, flat, planar surfaces are observed with the layer growing faster over the grooves than over the flat substrate portions so as to form a continuous, smooth surface. This growth habit of InP limits the utilization of the structure disclosed by Botez for light emitting devices of InP and related alloys. It would be desirable to have a light emitting device composed of InP and related alloys which exhibits an output light beam of comparable quality to that produced by the device of Botez.

SUMMARY OF THE INVENTION

A semiconductor light emitting device comprises a substrate, a first confinement layer overlying the substrate, an active layer overlying the first confinement layer and having a vee-groove therein extending through the active layer towards the first confinement layer. A second confinement layer fills the groove and overlies the remaining portion of the surface of the active layer. Electrical current flowing through the device is constrained to flow through vee-groove before entering the active layer thereby restricting the region of the active layer from which light emission can occur.

DETAILED DESCRIPTION OF THE INVENTION

Figure 1:
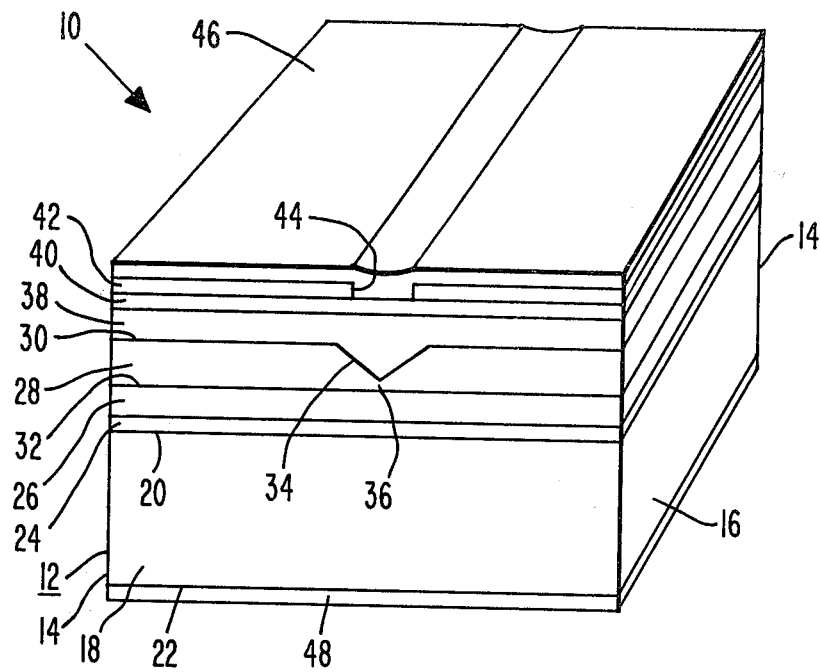
FIGS. 1 and 2 are a plan view and a side view respectively of a light emitting device of the invention.
Figure 2:
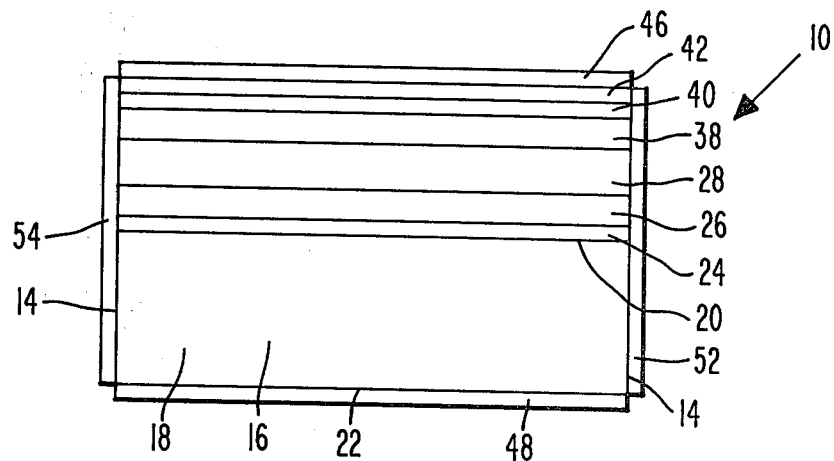

In FIGS. 1 and 2, the identification of the common elements of the light emitting device 10 is the same.

Referring to FIG. 1, the light emitting device 10 includes a semiconductor body 12 having parallel end faces 14, at least one of which is partially transmissive of light at the wavelength of the output light beam, and a pair of side surfaces 16 extending between the end faces 14. The semiconductor body 12 includes a substrate 18 having a pair of opposed surfaces 20 and 22. A buffer layer 24 overlies the surface 20 and a first confinement layer 26 overlies the buffer layer 24. An active layer 28 having a surface 30 overlies a flat surface of the first confinement layer 26, forming a boundary 32 therebetween. Typically the active layer 28 and the first confinement layer 26 are of opposite conductivity type so that the boundary 32 is also the p-n junction of the device. The active layer 28 has a vee-shaped groove 34 therein extending from the surface 30 through the active layer 28 toward the boundary 32 with the first confinement layer 26, leaving an emitting region 36 between the bottom of the groove 34 and the boundary 32. A second confinement layer 38 overlies the surface 30 of the active layer 28 and fills the groove 34. A capping layer 40 overlies the confinement layer 38. An electrically insulating layer 42 overlies the capping layer 38 and has an opening extending therethrough in the form of a stripe 44. A first electrically conducting layer 46 overlies the electrically insulating layer 42 and the surface of the capping layer 40 in the region of the stripe 44. A second electrically conducting layer 48 overlies the second surface 22 of the substrate 18. The first and second electrically conducting layers 46 and 48, respectively, form the electrical contacts to the body 12.

As shown in FIG. 2, a light reflector 52 such as that disclosed by Caplan et al. in U.S. Pat. No. 3,701,047 issued Oct. 24, 1972 and entitled SEMICONDUCTOR LASER DEVICES UTILIZING LIGHT REFLECTIVE METALLIC LAYERS or by Ettenberg in U.S. Pat. No. 4,092,659 issued May 30, 1978 and entitled MULTI-LAYER REFLECTIVE ELECTROLUMUNESCENT DEVICE overlies an end face 14 of a body 12 of the light emitting device 50. The opposed end face 14 may be coated with a light transmissive layer 54 which may be a layer of $Al_2O_3$ or similar material having an optical thickness of about one-half wave at the wavelength of the light emitted by the device as disclosed by Ladany et al. in U.S. Pat. No. 4,178,564 issued Dec. 11, 1979 and entitled HALF-WAVE PROTECTION LAYERS ON INJECTION LASERS. The patents to Caplan et al., Ettenberg and Ladany et al. referred to above are incorporated herein by reference.

The substrate 18, the buffer layer 24 and the first confinement layer 26 are of one conductivity type and the second confinement layer 38 and the capping layer 40 are of the opposite conductivity type. The index of refraction of the active layer 28 is greater than the that of the first and second confinement layers 26 and 30.

The substrate 18 is typically composed of a binary group III-V compound or alloys of such compounds, preferably of n-type InP having a surface 20 which is parallel to the (100) or (110) crystallographic plane. In the selection of the substrate and the layers deposited thereon, it is desirable that the layers be lattice matched to the substrate. Lattice matched means that the different layers have the same crystallographic structure and preferably have differences in their lattice constants of less than 0.1%.

The buffer layer 24 is typically composed of the same material and conductivity type as the substrate. This layer is used to provide a high-quality surface upon which the overlying layers can be deposited and is typically between about 3 and about 10 micrometers thick.

The first confinement layer 26 is typically composed of a material which is lattice matched to the buffer layer 24, is transmissive of light at the wavelength to the light emitted by the device and is typically between about 0.5 and 3 micrometers thick. Preferably this layer is composed of n-type InP.

The activer layer is typically between about 1 and about 10 micrometers thick and is preferably about 5 micrometers thick. This layer is either undoped or lightly p- or n-type conducting and may be composed of $In_xGa_{1-x}As_yP_{1-y}$ where the relative concentration of the elements is chosen to provide both an approximate lattice match to the first confinement layer 26 and an output light beam of the desired wavelength, as is disclosed for example, by Olsen et al. in the Journal of Electronic Materials 9, 977 (1980).

The second confinement layer 38 which fills the groove 34 and overlies the surface 30 of the active layer 28 is of the opposite conductivity type to the first confinement layer 26 and is composed of the material which is lattice matched to the underlying layers. The thickness of this layer over the surface 30 of the active layer 28 is typically between about 0.5 and about 3 micrometers. If the first confinement layer 26 is n-type InP the second confinement layer 38 is preferably composed of p-type InP and has an electrical conductivity much greater than that of the active layer 28.

The capping layer 40 may be used to improve the quality of the electrical contact made to the device 10. It is typically between about 0.1 and about 0.5 micrometers thick and, if the confinement layer is InP, is composed of an InGaAsP alloy which is lattice matched to and has the same conductivity type as the second confinement layer 38.

The electrically insulating layer 42 is preferably composed of silicon dioxide which may be deposited on the capping layer 40 by pyrolytic decomposition of a silicon containing gas, such as silane, in oxygen or water vapor. The stripe 44 in the electrically insulating layer 42 is formed using standard photo-lithographic and etching techniques and is preferably located over the vee groove 34 in the active layer 28. Alternatively other insulating materials such as silicon nitride may be used.

The electrically conducting layer 46 is preferably composed of titanium, platinum and gold and is deposited by sequential vacuum vaporation. One skilled in the art would realize that it is only necessary that the electrically conducting layer overlie the confinement layer in that portion of the surface over the vee-groove 36. The electrically conducting layer 48 on the surface 22 of the substrate 18 may be formed by vacuum deposition and sintering of tin and gold.

Alternatively, the capping layer 40 and the electrically insulating layer 42 may be eliminated by depositing upon the second confinement layer 38 a blocking layer which is of the opposite conductivity type to that of the second confinement layer and which has a region therein of same conductivity type as that of the confinement layer. The electrically conducting layer 46 may then overlie the entire surface of this blocking layer. Upon application of a bias voltage to the device 10, the p-n junction between the blocking layer and confinement layer is then reversed biased except in the region which has been converted to the same conductivity type as the confinement layer.

The different epitaxial layers may be deposited on the substrate 18 by liquid phase epitaxy as is disclosed by H. F. Lockwood et al. in U.S. Pat. No. 3,753,801 entitled METHOD OF DEPOSITING EXPITAXIAL SEMICONDUCTOR LAYERS FROM THE LIQUID PHASE issued Aug. 21, 1973 and which is incorporated herein by reference. Alternatively, the layers may be deposited by vapor phase expitaxy as is disclosed by Olsen et al. in U.S. Pat. No. 4,116,733 entitled VAPOR PHASE GROWTH TECHNIQUE OF III-V COMPOUNDS UTILIZING A PREHEATING STEP issued Sept. 26, 1978 and which is incorporated herein by reference.

It is to be understood that the device of the invention can be fabricated from combinations of group III–V alloys other than the InP-InGaAsP materials cited above. The individual layers may be of different conductivity types from those cited so long as the relationship of the conductivity types is maintained and the layers are lattice matched to one another.

The vee-shaped groove 34 is formed after the active layer 28 has been deposited by coating the surface 30 with a masking layer such as $SiO_2$, opening a stripe, preferably about 5 micrometers wide, in the masking layer which extends between the end faces of the body using well-known photo-lithographic and chemical etching techniques. The surface of the active layer is then etched to form the vee-groove using a suitable etchant such as $6H_2O+3HNO_3+2HCl$ or 0.1 to 1% bromine in methanol. Typically the etching process is continued until the thickness of the region 36 between the bottom of the groove 34 and the boundary 32 is less than about 0.5 micrometers and preferably between about 0.1 and about 0.2 micrometers thick. The masking layer is then removed and the remaining layers deposited.

In the operation of the light emitting device 10 or 50, a forward bias voltage applied between the electrically conducting layers causes an electrical current to flow through the device. Because of the greater electrical conductivity of the second confinement layer 38 as compared to the active layer 28, the current will preferentially flow through that portion of the second confinement layer 38 which fills the groove 34 in the active layer and then through the region 36 of the active layer between the bottom of the groove and the boundary 32. Light generated by recombination of injected carriers at the p-n junction will tend to be confined to the region beneath the bottom of the groove since the electrical resistance and the absorption of light will increase with lateral spreading of the recombination region, thereby providing a measure of control over the propagation of the light beam in the plane of the layers.

I claim:
1. A light emitting device comprising:
a semiconductor body having two end faces, at least one of which is partially transmissive of light, a pair of substantially parallel side faces between said end faces, said body comprising:
a substrate;
a first confinement layer overlying a first surface of said substrate and having a flat surface;
an active layer overlying said first confinement layer and having a vee-shaped groove therein extending from a surface thereof towards said flat surface of said first confinement layer and extending between said end faces;

a second confinement layer overlying said active layer and filling said groove;

a first electrically conducting layer overlying at least a portion of the surface of the second confinement layer; and a second electrically conducting layer overlying a portion of a second surface of the substrate;

the substrate and the first confinement layer are of one conductivity type and the second confinement layer is of the opposite conductivity type and the index of refraction of the active layer at the wavelength of a light beam emitted from the device is greater than that of the first and second confinement layers.

2. The device of claim 1, wherein a capping layer overlies the second confinement layer and an electrically insulating layer overlies the capping layer and has an opening extending therethrough and wherein the first electrically conducting layer overlies the capping layer in the opening in the electrically insulating layer.

3. The device of claim 2, wherein the first confinement layer and the second confinement layer are InP, the active and capping layers each comprise an alloy of $In_xGa_{1-x}As_yP_{1-y}$.

4. The device of claim 1 wherein the active layer is between about 1 and about 10 micrometers thick.

5. The device of claim 1, wherein the thickness of the active layer between the bottom of the groove and the first confinement layer is less than about 0.5 micrometer.

6. The device of claim 1 wherein a reflective coating overlies one end face of the semiconductor body and a light transmissive coating overlies the opposed end face of the semiconductor body.

7. The device of claim 1 wherein a buffer layer is interposed between the substrate and the first confinement layer.

* * * * *